March 17, 1959 J. W. BUTTERWORTH 2,878,451

PIEZOELECTRIC RESONATOR

Filed March 25, 1954

INVENTOR
J. W. BUTTERWORTH
BY [signature]
ATTORNEY

United States Patent Office 2,878,451
Patented Mar. 17, 1959

2,878,451

PIEZOELECTRIC RESONATOR

John William Butterworth, Wayne Township, N. J., assignor to Mackay Radio and Telegraph Company, New York, N. Y., a corporation of Delaware Application March 25, 1954, Serial No. 418,565

6 Claims. (Cl. 332—2)

This invention relates to piezoelectric resonators and more particularly to an arrangement for varying the electrical impedance of the piezoelectric resonator.

Many systems are known for amplifying small electrical signals. The one most widely used is the electron tube. More recently however, there have been developed such devices as the transistor, the magnetic amplifier, and the dielectric amplifier. Each of these amplifiers has specific and peculiar characteristics.

It is also known that mechanical energy can be converted into electrical energy by piezoelectric crystals. This is perhaps best exemplified by the crystal microphone which makes use of the piezoelectric effect of Rochelle salt crystals to transform mechanical stress produced by sound waves into electrical output. The most successful arrangement of this type makes use of a crystal slab consisting of two very thin Rochelle salt crystals arranged differentially and cemented together with foil electrodes so that a voltage across the electrodes causes one slab to increase in length while the other decreases. A mechanical bending of such a composite slab then produces a piezoelectric voltage across the crystal face.

In the article entitled "A Barium Titanate Transducer Capable of Large Motion at an Ultrasonic Frequency," by Mason and Wick, printed in The Journal of the Acoustical Society of America, March 15, 1951, there is discussed the piezoelectric properties of barium titanate. It is explained in this article that barium titanate has a natural resonant frequency controlled only by the length of the crystal, and that by imposing mechanical flexural vibrations in the barium titanate, piezoelectric voltages are produced. Thus, to succinctly summate the known properties of piezoelectric crystals, it is known that mechanical flexural vibrations can be converted into electrical energy and that crystals have inherent periods of natural resonance.

The phenomenon underlying this invention is in the fact that the electrical impedance of the piezoelectric resonator may be materially altered by applying a pressure to one end thereof.

Accordingly, it is an object of this invention to utilize the properties of a piezoelectric crystal composed of, for example, barium titanate and to produce a basically new electronic device such as an amplifier or modulator.

In accordance with an aspect of the invention, there is provided a piezoelectric resonator in which the electrical impedance is changed by applying a slight pressure to one end thereof. Thus, by coupling the piezoelectric resonator of this invention to an alternating-current generator, the output thereof can be amplified by applying a slight pressure to one part of the resonator, or modulated by applying a varying pressure to the resonator.

The above-mentioned and other objects of this invention and the manner of attaining them will become more apparent and the invention itself will be best understood, by reference to the following description of an embodiment of the invention taken in conjunction with the accompanying drawings, wherein.

Barium titanate, when suitably processed, exhibits piezoelectric characteristics which in some aspects are similar to those of piezoelectric quartz. An important difference however, between the two materials, is that barium titanate is essentially a low impedance material requiring low voltage for complete excitation. By way of comparison, a piezoelectric quartz resonator might require 10,000 to 30,000 volts of excitation, whereas barium titanate requires only 2 to 100 volts' excitation.

Figure 1:
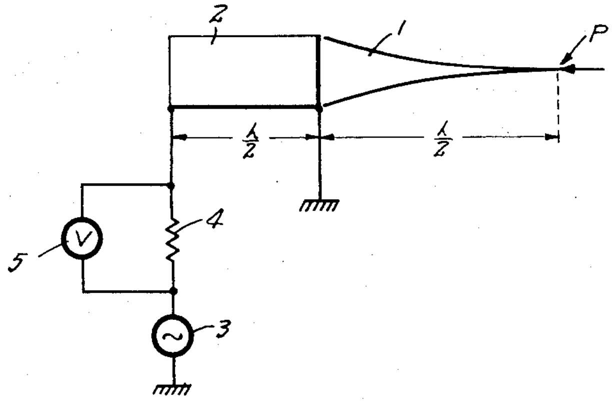
Fig. 1 is a schematic diagram of one embodiment of the invention.

Referring now to Fig. 1, there is shown a steel conical member 1 coupled preferably by solder, to a barium titanate body 2; the length of the conical member and the barium titanate body being each a half wavelength at the driving frequency. Coupled across the piezoelectric resonator 2 is an alternating-current, preferably radio-frequency, generator 3. The generator 3 generates for example, ultrasonic waves; a resistor 4 is provided for loading the generator 3. The unit comprising the crystal resonator 2 and the conical steel member 1 functions in such a way that the ultrasonic waves generated by the barium titanate are intensified as they are propagated toward the apex of the conical member 1. The purpose of the conical member is to produce a step-up of particle velocity from the base to the apex of the cone. The displacement ratio is in the order of base area to point area.

The electrical impedance of the barium titanate, when permitted to vibrate freely in series resonant mode, is considerably lower than the electrical impedance of the same piece clamped tightly so as to prevent vibration. The impedance of barium titanate is varied directly by the application of pressure, co-linearly with respect to the axes of the conical member and barium titanate body. The pressure may be applied directly on the apex of the conical member, for example by coupling a dynamic member such as an armature or driving coil to the apex of the cone, or indirectly by mounting a diaphragm of a microphone or loudspeaker, sufficiently close to the conical member to cause rarefaction of the apex.

By way of example, when the radio-frequency generator generated waves at 115 kilocycles per second and the value of resistor 4 was 5000 ohms, the series resonance of the barium titanate was 115 kilocycles per second and the parallel resonance was approximately 119 kilocycles per second. The voltage indicated on the voltmeter 5 coupled across resistor 4 changes from .2 volt to 2 volts, with a very slight change in pressure at point P. In this example, the amplification was 10:1.

Thus, it is apparent that if a load circuit is coupled across resistor 4, the energy fed to the output circuit may be amplified or modulated by appropriate application of pressure on point P.

Moreover, the resonator provides a means for selecting by means of the applied pressure, the desired frequency from a complex multifrequency signal. If, for example, a complex voltage consisting of two frequencies 115 and 119 kc. were applied to the resonator through a load circuit, the 115 kc. signal would be predominant across the load circuit in the absence of applied pressure. When pressure is applied, the 119 kc. signals would be predominant across the load circuit.

Figure 2:
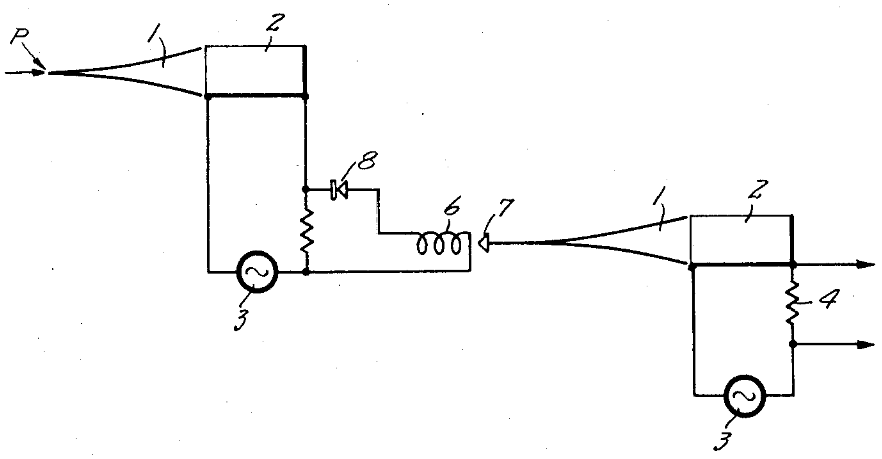
Fig. 2 is a schematic diagram of a pair of resonators cascade coupled.

Referring now to Fig. 2, there are shown a pair of resonator units coupled in cascade as a multi-stage audio-amplifier. The first stage comprises substantially the same elements as Fig. 1 and in addition, a loudspeaker comprising a driving coil 6 and a diaphragm 7. A rectifier 8 is provided for half-wave rectification of the generated waves. The second stage of the audio amplifier also comprises substantially the same elements as the first stage; the output being taken across the resistor 4. The first stage of amplification is obtained by varying the impedance of the barium titanate resonator by applying pressure to point P. The second stage of amplification is obtained by the pressure applied from the vibrating diaphragm which is mounted in close proximity to the apex of the second conical member as shown. It is to be realized that the driving coil 6 may be coupled directly to the apex of the second cone, thereby eliminating the need for a diaphragm. However, if the driving coil is so connected, it should be separated electrically from the apex of the second cone.

In the foregoing description, reference has been made to electrical impedance which is to be distinguished from acoustical impedance; the acoustical impedance is that physical impedance offered to acoustical waves passing through the piezoelectric body.

It has been found that when the piezoelectric resonator is operated in the series mode, a pressure applied to point P produces a positive change in the electrical impedance, and that when the piezoelectric resonator is operated in the parallel mode, a pressure applied to point P produces a negative change in impedance.

It is also to be realized that only the simple fundamentals of the invention have been explained hereinabove and that there are many possible variations of the basic idea. For example, the barium titanate may be cylindrical, or it may be a hexagonal. Moreover, the barium titanate may have applied on the surface thereof, a thin layer of conductive material such as silver on which connections may be made to the radio-frequency generator. Moreover, the manner of applying pressure to the point P may be effected by any suitable means. The loudspeaker arrangement has been used only for the purpose of describing the invention and using a positive example.

While I have described above the principles of my invention in connection with specific apparatus, it is to be clearly understood that this description is made only by way of example and not as a limitation as set forth in the objects thereof and in the accompanying claims.

What is claimed is:

1. A modulator comprising a piezo electric resonator having electrical impedance when vibrating in series resonant mode, an alternating current power source and a load all serially connected in an electrical circuit, the electrical impedance of the resonator having substantially a minimum value at a frequency which is substantially the same frequency as that of the power source, whereby unmodulated energy is delivered to said load from said source, and means for modulating said unmodulated energy comprising means for varying said electrical impedance.

2. A modulator in accordance with claim 1 wherein the means for varying the electrical impedance comprises a conical member with its base fastened to said resonator, the acoustical length of said conical member being an integral half-wave at the frequency of the power source whereby there is a transformation in the relative values of particle velocity and particle pressure between the base and apex of the conical member.

3. A modulator in accordance with claim 2 wherein the piezo electrical resonator has an acoustical wave length equal to an integral half-wave at the frequency of the power source.

4. A modulator in accordance with claim 3 wherein the piezo electric resonator consists essentially of barium titanate polarized along an axis which is colinear with the axis of the conical member.

5. A plural stage modulator comprising at least a first stage and a second stage, said first and second stages each comprising a modulator in accordance with claim 4, in combination with demodulator means connected between the load of said first stage and the input of said second stage.

6. A plural stage modulator in accordance with claim 5 wherein the demodulator means provides a half wave rectified current output of at least a portion of the modulated energy delivered to the load circuit of said first stage and the input to the second stage comprises a driving coil energized by said rectified current, said driving coil being coupled in energy transfer relation to the apex of the conical member of said second stage.

References Cited in the file of this patent

UNITED STATES PATENTS

| | | |
|---|---|---|
| 2,229,296 | La Mar et al. | Jan. 21, 1941 |
| 2,503,831 | Mason | Apr. 11, 1950 |
| 2,514,080 | Mason | July 4, 1950 |
| 2,540,412 | Adler | Feb. 6, 1951 |
| 2,573,168 | Mason et al. | Oct. 30, 1951 |
| 2,592,703 | Jaffe | Apr. 15, 1952 |